United States Patent
Shim et al.

(10) Patent No.: US 9,559,029 B2
(45) Date of Patent: Jan. 31, 2017

(54) SEMICONDUCTOR DEVICE AND METHOD OF FORMING INTERCONNECT STRUCTURE FOR ENCAPSULATED DIE HAVING PRE-APPLIED PROTECTIVE LAYER

(71) Applicant: STATS ChipPAC, Ltd., Singapore (SG)

(72) Inventors: Il Kwon Shim, Singapore (SG); Yaojian Lin, Singapore (SG); Seng Guan Chow, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/523,556

(22) Filed: Oct. 24, 2014

(65) Prior Publication Data

US 2015/0061124 A1  Mar. 5, 2015

Related U.S. Application Data

(60) Continuation of application No. 13/207,633, filed on Aug. 11, 2011, which is a continuation of application
(Continued)

(51) Int. Cl.
*H01L 21/44* (2006.01)
*H01L 23/31* (2006.01)
(Continued)

(52) U.S. Cl.
CPC .......... *H01L 23/3128* (2013.01); *H01L 21/56* (2013.01); *H01L 21/568* (2013.01);
(Continued)

(58) Field of Classification Search
CPC .... H01L 23/5389; H01L 21/50; H01L 21/568; H01L 23/3128; H01L 21/6835
(Continued)

(56) References Cited

U.S. PATENT DOCUMENTS 4,894,115 A   1/1990 Eichelberger et al.
5,157,001 A  10/1992 Sakuma
(Continued)

FOREIGN PATENT DOCUMENTS

CN       1246731 A   3/2000
CN     101192550 A   6/2008
(Continued)

*Primary Examiner* — Nitin Parekh
(74) *Attorney, Agent, or Firm* — Robert D. Atkins; Patent Law Group: Atkins and Associates, P.C.

(57) ABSTRACT

A semiconductor device has a protective layer formed over an active surface of a semiconductor wafer. The semiconductor die with pre-applied protective layer are moved from the semiconductor wafer and mounted on a carrier. The semiconductor die and contact pads on the carrier are encapsulated. The carrier is removed. A first insulating layer is formed over the pre-applied protective layer and contact pads. Vias are formed in the first insulating layer and pre-applied protective layer to expose interconnect sites on the semiconductor die. An interconnect structure is formed over the first insulating layer in electrical contact with the interconnect sites on the semiconductor die and contact pads. The interconnect structure has a redistribution layer formed on the first insulating layer, a second insulating layer formed on the redistribution layer, and an under bump metallization layer formed over the second dielectric in electrical contact with the redistribution layer.

15 Claims, 7 Drawing Sheets

Related U.S. Application Data

No. 12/822,080, filed on Jun. 23, 2010, now Pat. No. 8,004,095, which is a division of application No. 11/957,101, filed on Dec. 14, 2007, now Pat. No. 7,767,496.

(51) Int. Cl.

| | | |
|---|---|---|
| *H01L 21/56* | (2006.01) | |
| *H01L 21/683* | (2006.01) | |
| *H01L 23/538* | (2006.01) | |
| *H01L 23/00* | (2006.01) | |
| *H01L 25/10* | (2006.01) | |
| *H05K 1/18* | (2006.01) | |
| *H01L 25/16* | (2006.01) | |
| *H01L 21/768* | (2006.01) | |
| *H01L 23/48* | (2006.01) | |
| *H01L 23/528* | (2006.01) | |
| *H01L 23/50* | (2006.01) | |
| *H05K 3/46* | (2006.01) | |

(52) U.S. Cl.
CPC ........ *H01L 21/6835* (2013.01); *H01L 21/768* (2013.01); *H01L 21/76802* (2013.01); *H01L 21/76877* (2013.01); *H01L 23/3114* (2013.01); *H01L 23/481* (2013.01); *H01L 23/528* (2013.01); *H01L 23/5389* (2013.01); *H01L 24/14* (2013.01); *H01L 24/18* (2013.01); *H01L 24/19* (2013.01); *H01L 24/96* (2013.01); *H01L 25/105* (2013.01); *H01L 25/16* (2013.01); *H05K 1/185* (2013.01); *H05K 1/186* (2013.01); *H01L 23/50* (2013.01); *H01L 2221/68345* (2013.01); *H01L 2224/04105* (2013.01); *H01L 2224/12105* (2013.01); *H01L 2224/13025* (2013.01); *H01L 2224/16* (2013.01); *H01L 2224/18* (2013.01); *H01L 2224/24195* (2013.01); *H01L 2224/32225* (2013.01); *H01L 2224/82039* (2013.01); *H01L 2224/8314* (2013.01); *H01L 2224/83132* (2013.01); *H01L 2224/83192* (2013.01); *H01L 2224/92144* (2013.01); *H01L 2225/1023* (2013.01); *H01L 2225/1058* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01015* (2013.01); *H01L 2924/01029* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/12042* (2013.01); *H01L 2924/14* (2013.01); *H01L 2924/15174* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/30105* (2013.01); *H05K 3/4602* (2013.01); *H05K 2201/09509* (2013.01); *H05K 2201/10674* (2013.01)

(58) Field of Classification Search
USPC .......... 438/118, 108, 127, E21.503
See application file for complete search history.

(56) References Cited

U.S. PATENT DOCUMENTS

| | | |
|---|---|---|
| 5,161,093 A | 11/1992 | Gorczyca et al. |
| 5,250,843 A | 10/1993 | Eichelberger |
| 5,353,498 A | 10/1994 | Fillion et al. |
| 5,524,339 A * | 6/1996 | Gorowitz ............... H01L 23/29 257/E23.117 |
| 5,527,741 A | 6/1996 | Cole et al. |
| 5,703,400 A | 12/1997 | Wojnarowski et al. |
| 5,814,193 A | 9/1998 | Crowe |
| 5,834,340 A | 11/1998 | Sawai et al. |
| 5,841,193 A | 11/1998 | Eichelberger |
| 5,866,952 A | 2/1999 | Wojnarowski et al. |
| 6,025,995 A | 2/2000 | Marcinkiewicz |
| 6,028,364 A | 2/2000 | Ogino et al. |
| 6,052,995 A | 4/2000 | Krimmer et al. |
| 6,110,773 A | 8/2000 | Lee |
| 6,168,966 B1 | 1/2001 | Fan et al. |
| 6,187,615 B1 | 2/2001 | Kim et al. |
| 6,197,613 B1 | 3/2001 | Kung et al. |
| 6,271,469 B1 | 8/2001 | Ma et al. |
| 6,351,031 B1 * | 2/2002 | Iijima ................... H01L 21/563 257/635 |
| 6,423,571 B2 | 7/2002 | Ogino et al. |
| 6,501,164 B1 * | 12/2002 | Chen ................... H01L 23/3128 257/686 |
| 7,008,822 B2 | 3/2006 | Bolken et al. |
| 7,165,316 B2 | 1/2007 | Fjelstad |
| 7,189,596 B1 | 3/2007 | Mu et al. |
| 7,192,807 B1 | 3/2007 | Huemoeller et al. |
| 7,514,767 B2 * | 4/2009 | Yang ................... H01L 23/5389 257/666 |
| 7,569,427 B2 | 8/2009 | Theuss |
| 7,598,117 B2 | 10/2009 | Kurita et al. |
| 7,619,901 B2 | 11/2009 | Eichelberger et al. |
| 7,642,128 B1 | 1/2010 | Lin et al. |
| 7,657,157 B2 | 2/2010 | Okabayashi et al. |
| 7,666,709 B1 | 2/2010 | Lin et al. |
| 7,675,131 B2 | 3/2010 | Derderian |
| 7,675,157 B2 | 3/2010 | Liu et al. |
| 7,741,194 B2 | 6/2010 | Griffiths |
| 7,767,496 B2 | 8/2010 | Shim et al. |
| 7,830,004 B2 * | 11/2010 | Wu ....................... H01L 23/142 257/698 |
| 7,888,238 B2 | 2/2011 | Wakisaka et al. |
| 7,915,690 B2 | 3/2011 | Shen |
| 8,012,807 B2 | 9/2011 | Meyer et al. |
| 8,035,231 B2 | 10/2011 | Kurita et al. |
| 8,039,303 B2 | 10/2011 | Shim et al. |
| 8,097,489 B2 | 1/2012 | Pagaila et al. |
| 8,188,584 B1 | 5/2012 | Berry et al. |
| 8,193,647 B2 | 6/2012 | Hsieh et al. |
| 8,258,633 B2 | 9/2012 | Sezi et al. |
| 2003/0013232 A1 | 1/2003 | Towle et al. |
| 2003/0141105 A1 | 7/2003 | Sugaya et al. |
| 2004/0056344 A1 | 3/2004 | Ogawa et al. |
| 2004/0110316 A1 | 6/2004 | Ogihara et al. |
| 2004/0219717 A1 | 11/2004 | Takahashi et al. |
| 2005/0121771 A1 | 6/2005 | Lin et al. |
| 2005/0186704 A1 | 8/2005 | Yee et al. |
| 2006/0046347 A1 | 3/2006 | Wood et al. |
| 2006/0063312 A1 | 3/2006 | Kurita |
| 2006/0084240 A1 | 4/2006 | Poo et al. |
| 2006/0125072 A1 * | 6/2006 | Mihara ................ H01L 23/5389 257/686 |
| 2007/0035015 A1 * | 2/2007 | Hsu ...................... H01L 23/5389 257/723 |
| 2007/0035033 A1 * | 2/2007 | Ozguz ................. H01L 21/4803 257/777 |
| 2007/0040258 A1 | 2/2007 | Sheats |
| 2007/0085188 A1 * | 4/2007 | Chang ................. H01L 23/5389 257/686 |
| 2007/0141759 A1 * | 6/2007 | Nagase ............... H01L 23/5389 438/126 |
| 2007/0178622 A1 | 8/2007 | Liu et al. |
| 2007/0249153 A1 | 10/2007 | Dong |

(56) References Cited

U.S. PATENT DOCUMENTS

| | | |
|---|---|---|
| 2008/0006900 A1 | 1/2008 | Chan et al. |
| 2008/0012144 A1 | 1/2008 | Meyer et al. |
| 2008/0054426 A1 | 3/2008 | Ohno et al. |
| 2008/0090335 A1 | 4/2008 | Morimoto et al. |
| 2008/0119004 A1* | 5/2008 | Burch .............. H01L 21/561 438/51 |
| 2008/0136004 A1 | 6/2008 | Yang et al. |
| 2008/0188037 A1 | 8/2008 | Lin |
| 2008/0217761 A1 | 9/2008 | Yang et al. |
| 2008/0246126 A1* | 10/2008 | Bowles ............ H01L 23/3114 257/659 |
| 2008/0265383 A1 | 10/2008 | Brunnbauer et al. |
| 2008/0313894 A1 | 12/2008 | Fillion et al. |
| 2008/0315385 A1 | 12/2008 | Gerber et al. |
| 2009/0008793 A1 | 1/2009 | Pohl et al. |
| 2009/0140442 A1 | 6/2009 | Lin |
| 2009/0146282 A1 | 6/2009 | Tay et al. |
| 2009/0152715 A1 | 6/2009 | Shim et al. |
| 2009/0309212 A1 | 12/2009 | Shim et al. |
| 2010/0258937 A1 | 10/2010 | Shim et al. |
| 2011/0095404 A1 | 4/2011 | Yamano et al. |
| 2011/0114950 A1 | 5/2011 | Huang |
| 2011/0198762 A1 | 8/2011 | Scanlan |
| 2011/0221055 A1 | 9/2011 | Lin et al. |
| 2011/0221057 A1 | 9/2011 | Lin et al. |
| 2011/0244657 A1 | 10/2011 | Grivna et al. |
| 2011/0254156 A1 | 10/2011 | Lin |
| 2011/0256690 A1 | 10/2011 | Huang |

FOREIGN PATENT DOCUMENTS

| | | |
|---|---|---|
| CN | 101261984 A | 9/2008 |
| CN | 101752273 A | 6/2010 |
| JP | 2007184636 A | 7/2007 |

\* cited by examiner

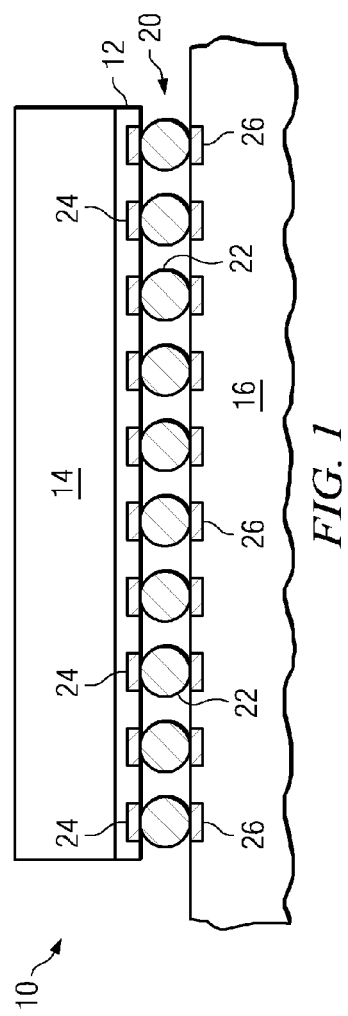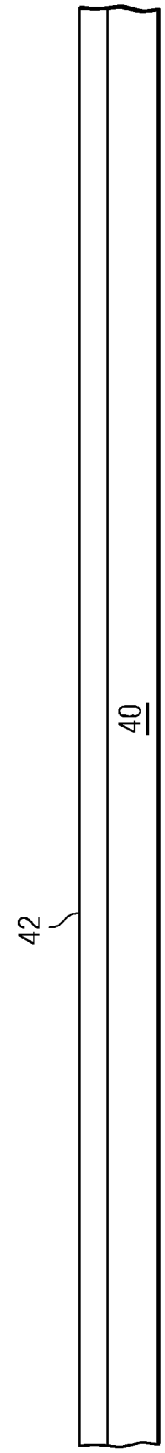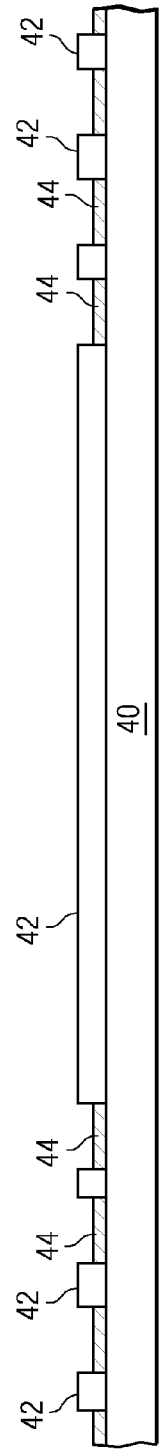

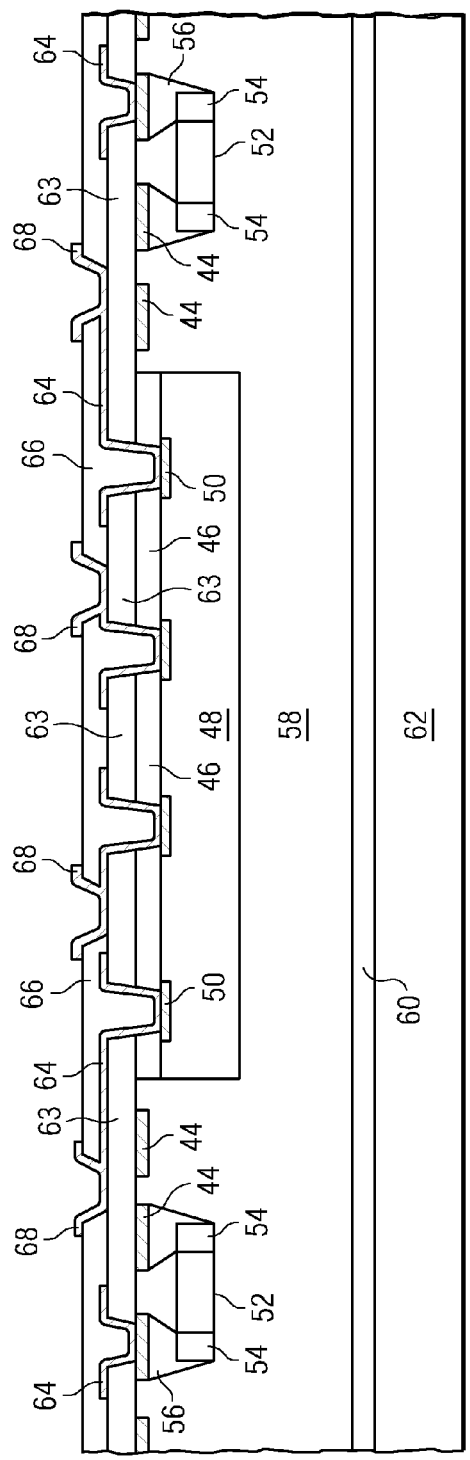
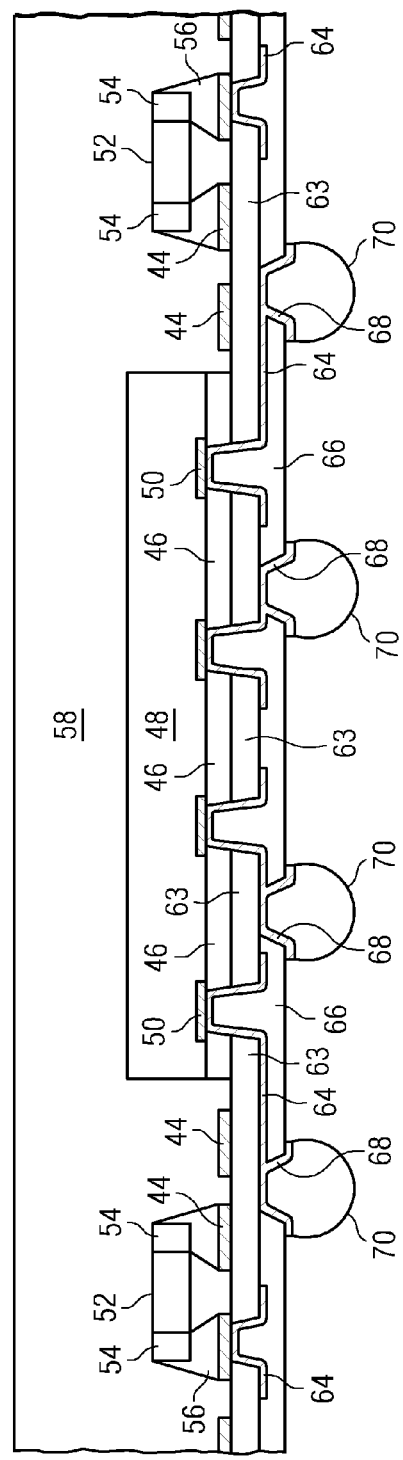
FIG. 2h
FIG. 2i

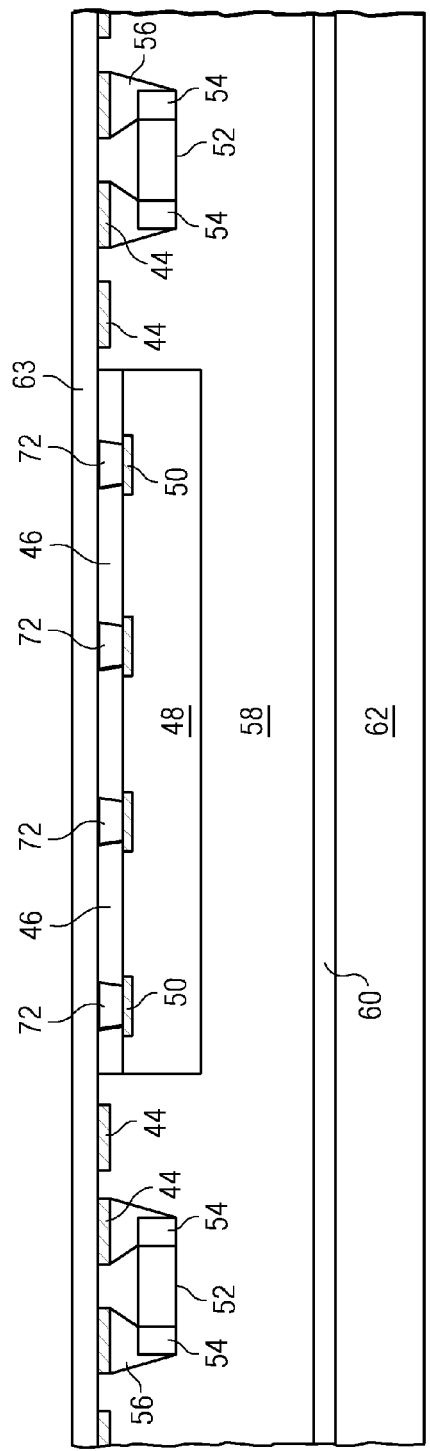
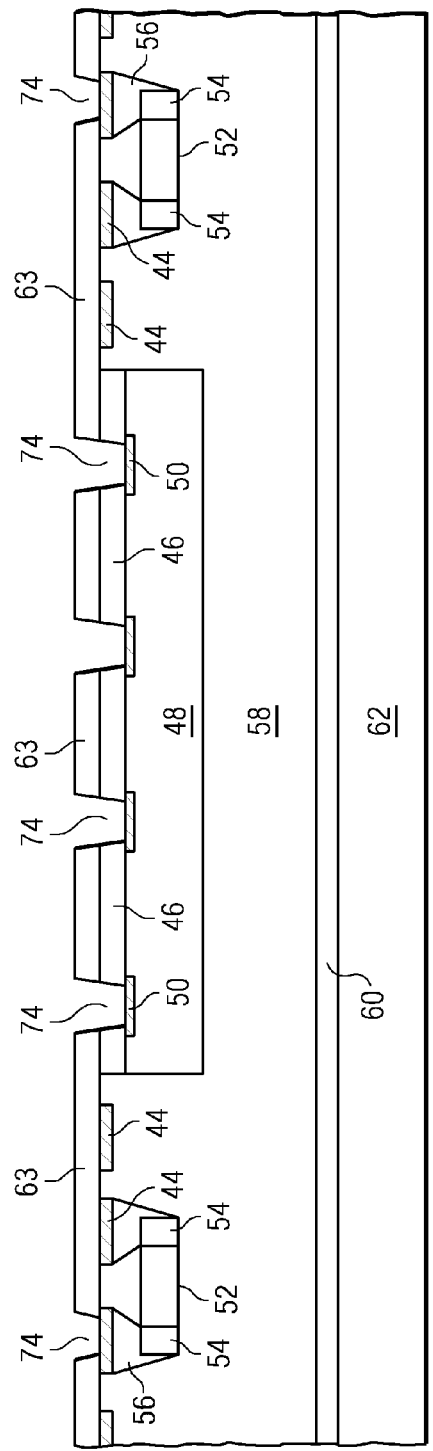
FIG. 3a
FIG. 3b

SEMICONDUCTOR DEVICE AND METHOD OF FORMING INTERCONNECT STRUCTURE FOR ENCAPSULATED DIE HAVING PRE-APPLIED PROTECTIVE LAYER

CLAIM TO DOMESTIC PRIORITY

The present application is a continuation of U.S. patent application Ser. No. 13/207,633, filed Aug. 11, 2011, which is a continuation of U.S. patent application Ser. No. 12/822,080, now U.S. Pat. No. 8,004,095, filed Jun. 23, 2010, which is a division of U.S. patent application Ser. No. 11/957,101, now U.S. Pat. No. 7,767,496, filed Dec. 14, 2007, which applications are incorporated herein by reference.

FIELD OF THE INVENTION

The present invention relates in general to semiconductor devices and, more particularly, to a wafer level chip scale package (WLCSP) with interconnect structure, in which a semiconductor die is prepared from a semiconductor wafer having protective layer on the front or active side of the wafer.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In a semiconductor package, a semiconductor die is encapsulated by a molding material using a process which leaves the active surface of the semiconductor die exposed after encapsulation. An interconnect build-up layer, including dielectric layers, metalized redistribution layers, and under bump metallurgy layer, is disposed over the active surface of the chip and the molding compound. Solder bumps or other electrical interconnections are then formed on the interconnect build-up layer, making the semiconductor die capable of electrically connecting to external devices.

The encapsulation of the semiconductor die includes using a substrate on which the die is set facedown and allowing the molding compound to flow around and over the die without coating the active surface. In the resulting semiconductor package, the molding material is thinner over the semiconductor die than the surrounding area. Thus, delamination can occur between the semiconductor die and encapsulating material as a result of the difference between the coefficients of thermal expansion (CTE) of the molding material and the semiconductor die.

A mismatch of CTEs can also damage the area where the solder bumps connect to the interconnect build-up layer. Solder joints are fragile elements of a semiconductor package due to their small size and use at high temperatures relative to their melting points. Solder joint failure can occur for a variety of reasons. One category of failure arises from the application of cyclical stresses, primarily from temperature swings and the different CTEs of the solder joints and application board. As solder joint failures can result from standard daily events, such as powering on and off electrical equipment, solder joint reliability is important in the manufacture of WLCSPs.

A need exists to resolve solder joint failure and intermediate interconnect build-up layer delamination issues on WLCSPs due to CTE mismatch between the die and mounting board or interconnect build-up layer.

SUMMARY OF THE INVENTION

In one embodiment, the present invention is a method of making a semiconductor device comprising the steps of providing a semiconductor die, providing a first insulating layer over the semiconductor die, forming a second insulating layer over the first insulating layer, and forming an interconnect structure over the semiconductor die by using a laser to form an opening through the first insulating layer and second insulating layer. The interconnect structure is electrically connected to the semiconductor die.

In another embodiment, the present invention is a method of making a semiconductor device comprising the steps of providing a semiconductor die, providing a first insulating layer over the semiconductor die, and forming an interconnect structure over the semiconductor die by using a laser to form a first opening through the first insulating layer. The interconnect structure is electrically connected to the semiconductor die.

In another embodiment, the present invention is a semiconductor device comprising a semiconductor die. A first insulating layer is disposed over the semiconductor die. The first insulating layer includes a first laser-formed opening. An encapsulant is deposited around the semiconductor die. An interconnect structure is formed over the semiconductor die and encapsulant. The interconnect structure is electrically connected to the semiconductor die through the first laser-formed opening in the first insulating layer.

In another embodiment, the present invention is a semiconductor device comprising a semiconductor die. An encapsulant is deposited around the semiconductor die. A first insulating layer is disposed over the semiconductor die and encapsulant. The first insulating layer includes a first laser-formed opening. A first conductive layer is formed within the first laser-formed opening and over the first insulating layer.

BRIEF DESCRIPTION OF THE DRAWINGS

FIG. 1 is a flip chip semiconductor device with solder bumps providing electrical interconnect between an active area of the die and a chip carrier substrate;

FIGS. 2a-2i illustrate the method of making a WLCSP with an interconnect build-up layer;

FIGS. 3a and 3b illustrate an alternative embodiment of the WLCSP made in FIGS. 2a-2i;

DETAILED DESCRIPTION OF THE DRAWINGS

Figure 2C:
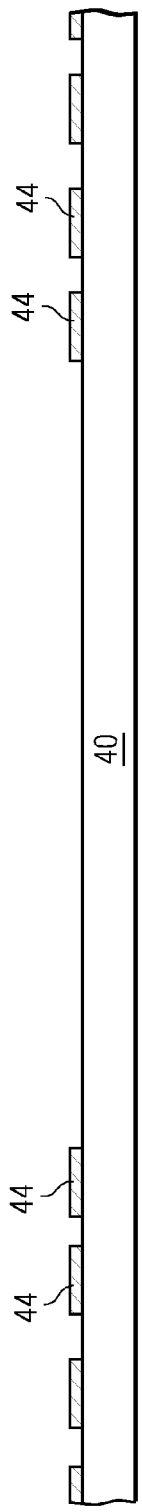

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2a-2i illustrate the method of making a wafer level chip scale package (WLCSP) with an interconnect structure, in which the semiconductor die is prepared from a semiconductor wafer having a pre-applied protective layer on the active side of the wafer. In FIG. 2a, a metal carrier 40 is shown having a photoresist layer 42 applied to a top surface of metal carrier 40. The metal carrier 40 is made of copper (Cu), aluminum (Al), or other electrically conducting metal. Carrier 40 acts as a support member to hold a semiconductor die and plated metal pads in place during the manufacturing process. During a subsequent electroplating process, metal carrier 40 also serves as a plating current path to form plated metal pads on the carrier.

In FIG. 2b, a plurality of openings or vias are made in the photoresist layer 42 using a photo patterning process such as ultraviolet (UV) exposure and development. The openings define areas for selective plating and can be strategically placed, allowing the areas, when plated, to act as fiducial marks, interconnection contact pads, and saw alignment marks. Metal contact pads 44 are deposited in the openings and onto metal carrier 40 using an electroplating process. Contact pads 44 can be made with electroless nickel/immersion gold (Ni/Au) or other metal or alloy having low resistivity. Once contact pads 44 have been deposited, photoresist layer 42 is stripped off metal carrier 40 through either UV or thermal curing, as shown in FIG. 2c.

In a separate part of the process, a protective layer is pre-applied to the active surface of a semiconductor wafer containing a plurality of semiconductor die. The protective layer is a lamination or coating adhesive applied by spin coating or screen printing. The protection layer is an insulator and can be made with polyimide (PI) film having a low coefficient of thermal expansion (CTE), such as 20 ppm/° C. or below, or a low modulus silicon base elastomer, under pressure of less than 200 MPa.

Vias or openings can be formed in the active surface of the semiconductor wafer by laser drilling or deep reactive ion etching (DRIE). Photo vias can be formed if photosensitive adhesive layer is applied. The wafer is placed protective layer down to dicing tape and cut with a dicing blade. A pick and place tool removes the individual die with its pre-applied protective layer and places the die on metal carrier 40.

Figure 2D:
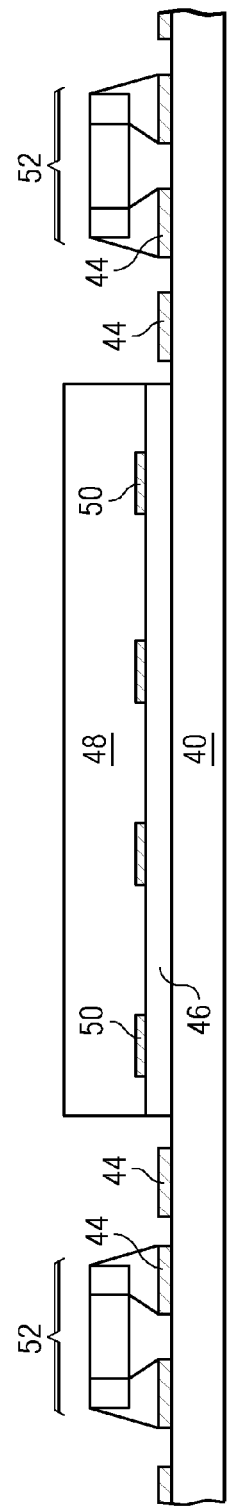

FIG. 2d illustrates semiconductor die 48 with pre applied protective layer 46 mounted face down on metal carrier 40. The protective layer 46 can be used as the die attach material. The interconnect sites 50 electrically connect to active and passive devices on semiconductor die 48 through conduction tracks or layers formed within the die. The conductive material can be Al, Cu, tin (Sn), nickel (Ni), gold (Au), or silver (Ag).

In one embodiment, metal carrier 40 has one or more passive components 52 with electrodes 54 electrically connected to metal pads 44 with conductive adhesive 56. Passive components 52 can include resistors, capacitors, inductors, transformers, voltage sources, current sources, or similar devices.

Figure 2E:
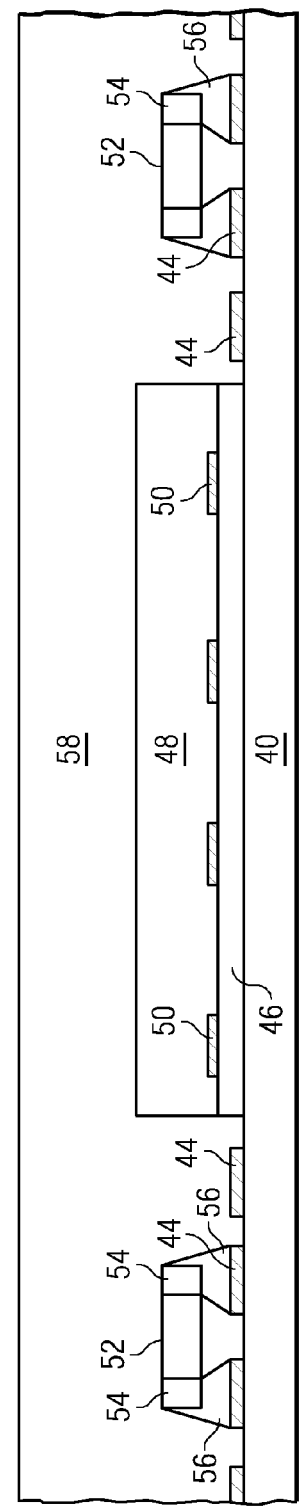

In FIG. 2e, the structure formed in FIG. 2d is encapsulated with a polymer molding compound 58 down to metal carrier 40. The molding compound 58 is non-conductive and environmentally protects the semiconductor device from external elements and contaminants. Molding compound 58 can be made with epoxy acrylate or other polymer material and applied by transfer molding, liquid encapsulant molding, or other molding process.

Carrier 40 is removed by an etching process, exposing protective layer 46 of semiconductor die 48 and metal pads 44. With metal carrier 40 removed, molding compound 58 provides rigid support for the semiconductor device.

Figure 2F:
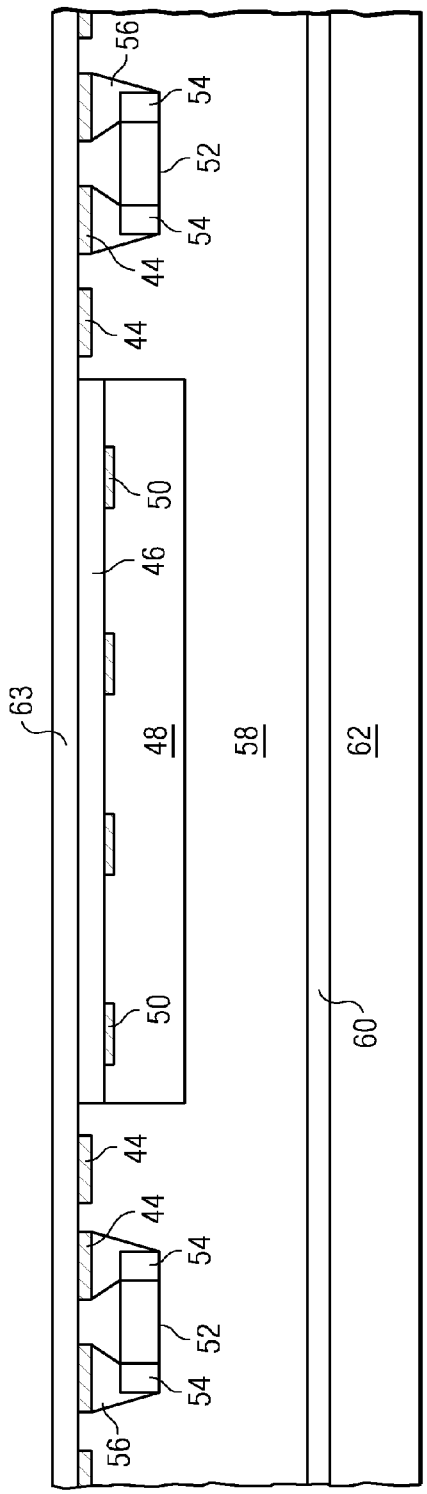

In FIG. 2f, the semiconductor package is inverted such that interconnect sites 50 and active surface of semiconductor die 48 face upwards. An insulating layer 63 is applied to contact pads 44, protective layer 46, and molding compound 58. The insulating layer 63 is made with dielectric or photosensitive polymer material having low cure temperature, e.g. less than 200° C. A process carrier 62 is applied to a surface of molding compound 58, opposite protective layer 46, using an adhesive layer 60. Carrier 62 facilitates the process handling in the subsequent interconnect build-up process.

Figure 2G:
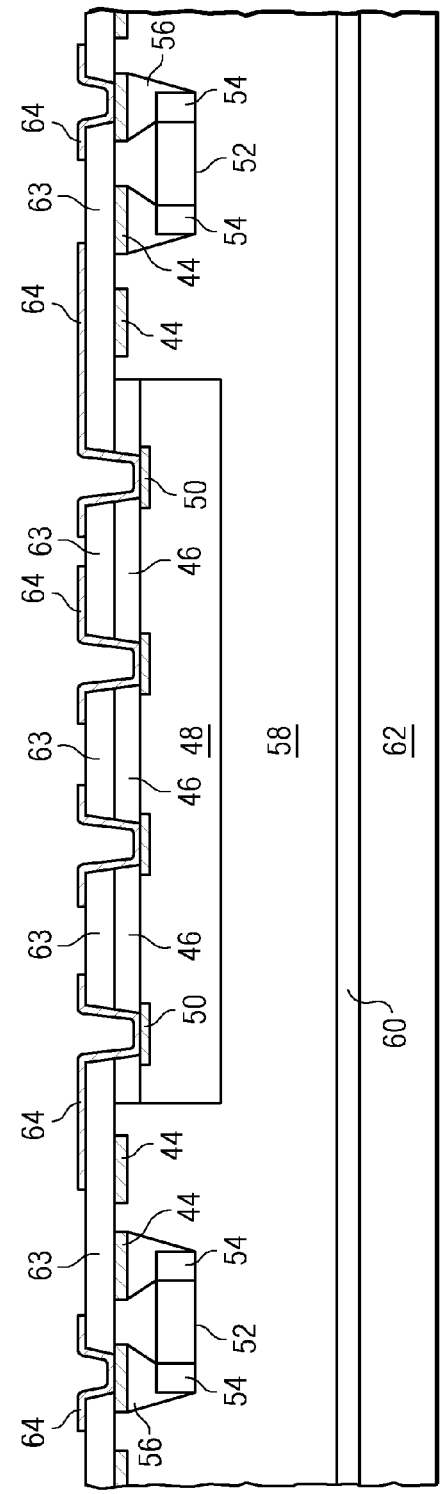

In FIG. 2g, a portion of insulating layer 63 and protective layer 46 is removed to form openings and expose contact pads 44 and interconnect sites 50. The openings can be formed using a photo patterning process if insulating layer 63 and protection layer 46 are photosensitive. Alternatively, if the protective layer 46 is not photosensitive, the openings are formed by laser drilling or DRIE process.

A metallized redistribution layer (RDL) 64 is formed by depositing thin layers of metals over the surface of insulating layer 63 and protection layer 46. Multiple metal layers are typically required to meet the different functional requirements of the metallized RDL such as adhesion, barrier, conductor, and protection. Accordingly, RDLs 64 can be made with layers of Al, titanium (Ti), and titanium tungsten (TiW). RDLs 64 provide electrical contact between metal pads 44 and interconnect sites 50 and subsequent layers.

In FIG. 2h, an insulating layer 66 is formed over insulating layer 63 and RDLs 64. The insulating layer 66 is made with dielectric or photosensitive polymer material having low cure temperature, e.g. less than 200° C. A portion of insulating layer 66 is removed using a photo patterning process such as UV exposure and development to expose RDLs 64. The insulating layers 63 and 66 and RDLs 64 constitute at least a portion of the interconnect build-up layer. Additional photosensitive insulating layers, metalized RDLs, and other conductive layers can be added as needed to expand the interconnect build-up layers to meet the interconnect requirements for the functional design of semiconductor die 48.

Interconnection contact pads, known as an under bump metallurgy layer (UBM) 68, are deposited and patterned to electrically contact RDLs 64. UBMs 68 provide multiple benefits to the semiconductor package: (1) an interface between the interconnect sites 50 and subsequent electrical interconnections, (2) protection of interconnect sites 50 from the environment, (3) low resistive contact between interconnect sites 50 and the subsequent electrical interconnections, (4) a barrier to solder diffusion into the metal pad, and (5) a seed layer for solder wettability. UBMs 68 are made by forming successive layers of metals by sputtering, each layer having a different function. These layers may include an adhesion layer, diffusion layer, solder wettable layer, and protective layer.

In FIG. 2i, solder bumps 70 are formed on UBMs 68. The solder bumps 70 electrically connect interconnect sites 50 and metal pads 44 with other electrical devices. The solder bumps 70 may be deposited through an evaporation, electrolytic plating, electroless plating, ball drop, or screen printing process and are formed from any metal or electrically conductive material, e.g., Sn, lead (Pb), Ni, Au, Ag, Cu, bismuthinite (Bi), and alloys thereof. The solder bumps 70 represent one type of electrical interconnect structure. Finally, carrier 62 is removed either after attaching solder bumps 70 or after wafer singulation.

FIGS. 3a and 3b illustrate an alternative embodiment of the WLCSP made in FIGS. 2a-2i. As with the previously described semiconductor package, a metal carrier having a photoresist layer is used as a support member. Openings are made in the photoresist layer to define the areas where metal pads 44 are deposited and, once deposited, the photoresist layer is stripped off.

In FIG. 3a, vias 72 are pre-formed in protective layer 46 to expose interconnect sites 50. The semiconductor die 48 is mounted to the metal carrier in a face down position and encapsulated, along with passive components 52, with molding compound 58. The metal carrier is stripped from the semiconductor device and insulating layer 63 is formed on contact pads 44 and protective layer 46. Vias 74, shown in FIG. 3b, are made in insulating layer 63 using a photo patterning process, such as UV exposure and development, directly coupling vias 74 with vias 72 in protective layer 46. The vias 74 in insulating layer 63 are typically the same size or larger than vias 72 in protective layer 46. Vias 74 are aligned with vias 72 to expose interconnect sites 50. As with the previous embodiment, metallized RDLs and additional insulating layers are formed as needed for the interconnect build-up process and, finally, the electrical interconnections are formed, see FIGS. 2g-2i.

Figure 4:
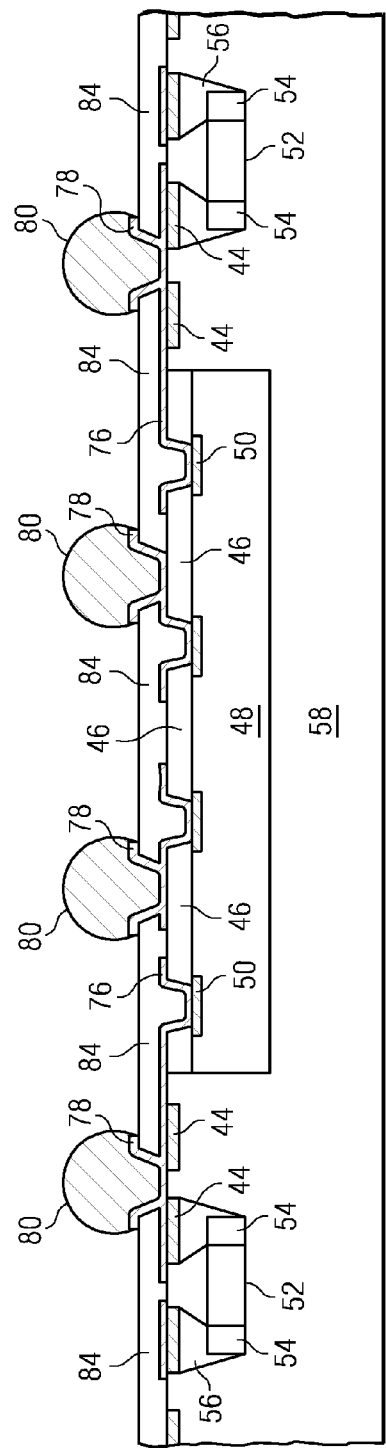
FIG. 4 illustrates an embodiment of a WLCSP where the redistribution layer is applied directly to the surface of the molding compound and protective layer of the semiconductor die.

FIG. 4 illustrates another embodiment of a semiconductor package. A metal carrier having a photoresist layer is used as a support member. Openings are made in the photoresist layer to define the areas where metal pads 44 are deposited and, once deposited, the photoresist layer is stripped off. A semiconductor die 48, having a pre-applied protective layer 46 on its face, is applied facedown to the metal carrier. The semiconductor die 48 may optionally have pre-formed vias similar to the embodiment illustrated in FIGS. 3a-3b. The semiconductor die 48 is encapsulated, along with passive components 52, with molding compound 58. Next, the metal carrier is stripped from the semiconductor device.

Figure 5:
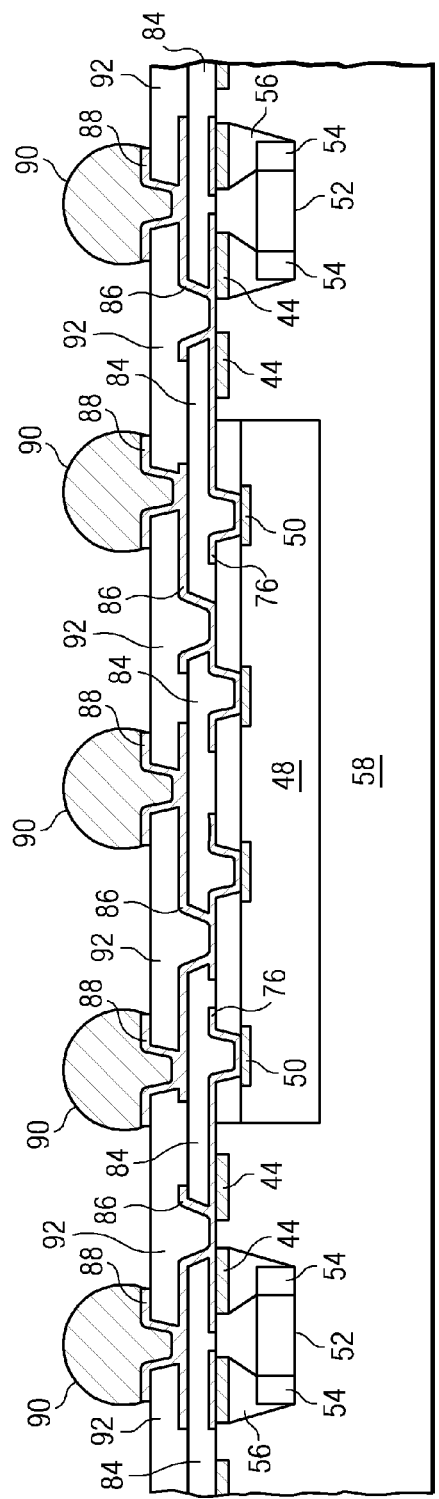
FIG. 5 illustrates the embodiment of FIG. 4 where an additional metallized redistribution layer and insulating layer have been added.

Vias are formed in protective layer 46 if semiconductor die 48 does not have pre-formed vias. Unlike previous embodiments, FIG. 4 shows that RDL 76 is applied directly to the surface of protective layer 46, molding compound 58, and contact pads 46 using a chemical vapor disposition (CVD), physical vapor deposition (PVD), and/or plating process. The insulating layer 63 is not used in this embodiment. RDLs 76 can be made of Al, Ti, TiW, or other metal. An insulating layer 84 is applied to RDLs 76 and vias are formed, exposing RDLs 76. UBMs 78 can be plated to form the final metal pad areas. Solder bumps 80 are formed on UBMs 78.p In FIG. 5, a second metalized RDL 86 is formed on insulating layer 84 and is electrically connected to RDL 76. An insulating layer 92 is formed over RDL 86 and insulating layer 84. The insulating layer 92 is made with dielectric or photosensitive polymer material having low cure temperature, e.g. less than 200° C. Vias are formed in insulating layer 92 to expose portions of RDLs 86. Optionally, UBMs 88 can be plated to form the final metal pad areas. Solder bumps 90 are formed on UBMs 88.

Figure 6A:
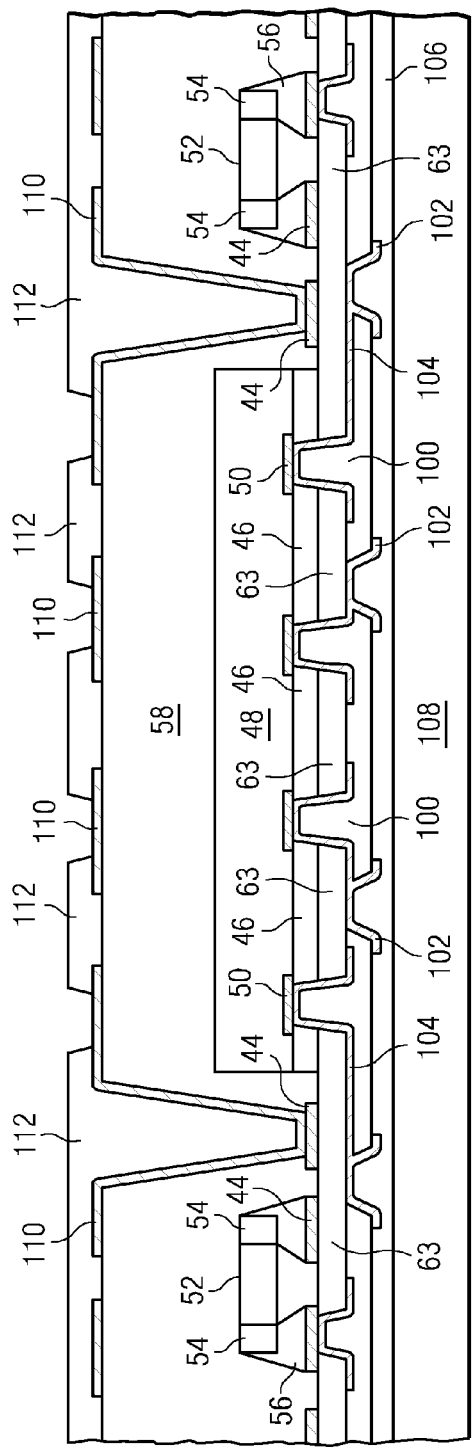
FIGS. 6a-6b illustrate a redistribution layer formed in the molding compound of the semiconductor package.
Figure 6B:
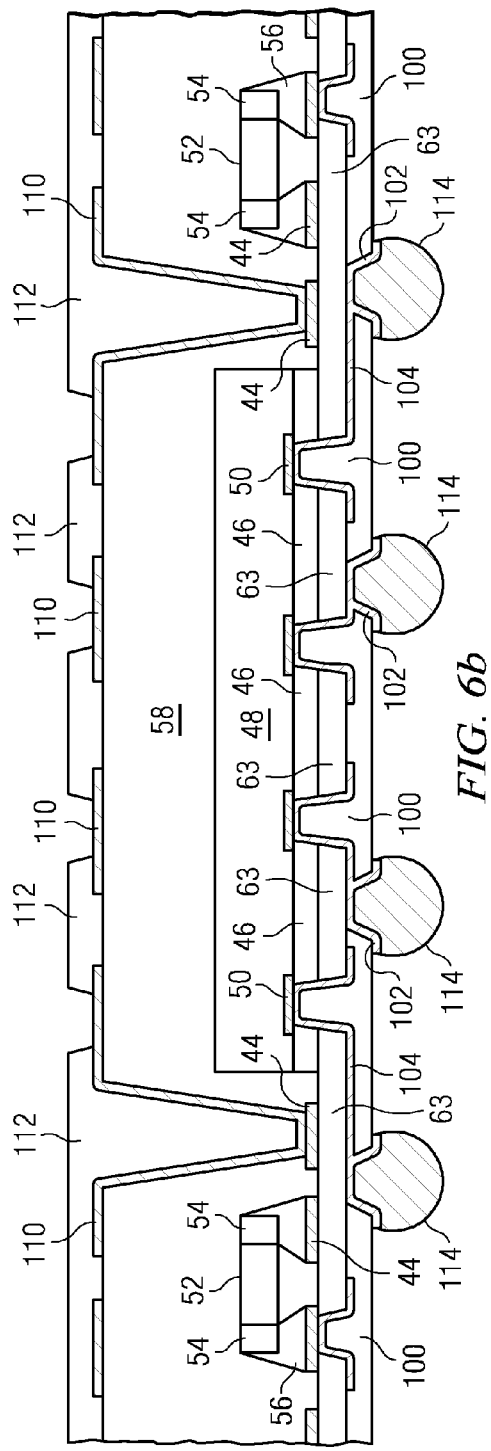

In FIGS. 6a and 6b, openings are made in photoresist layer that has been applied to the metal carrier. The openings define the areas where metal pads 44 are deposited and, once deposited, the photoresist layer is stripped off. A semiconductor die 48, with optional pre-formed vias in the protective layer 46, is applied to the metal carrier in a facedown position. The semiconductor die 48 is encapsulated, along with passive components 52, with molding compound 58. The metal carrier is stripped from the semiconductor device and insulating layer 63 is applied to contact pads 44 and protective layer 46. Vias are formed in insulating layer 63 and protective layer 46, if protective layer 46 did not have pre-formed vias.

As can be seen in FIG. 6a, a metalized RDL 104 is formed on insulating layer 63 and protective layer 46. A second photosensitive insulating layer 100 is applied on top of insulating layer 63, covering RDLs 104. Vias are formed in insulating layer 100. Additional photosensitive insulating layers and metalized RDLs may be added as needed to form the interconnect build-up layers. Additionally, an optional UBMs 102 can be plated in insulating layer 100.

A temporary carrier 108 is applied to the bottom side of molding compound 58 using an adhesive layer 106. The temporary carrier 108 can be made of a stiff material or flexible tape and facilitates the interconnect build-up process formed on the top surface of molding compound 58. Vias or openings are formed through molding compound 58 to expose metal pads 44 using a laser drill or DRIE process. Another metallized RDL 110 is formed on the top surface of molding compound 58 and the vias made in molding compound 58. An insulating layer 112 is applied over RDLs 110. The insulating layer 112 is made with dielectric or photosensitive polymer material having low cure temperature, e.g. less than 200° C. Next, vias or openings are made in insulating layer 112, exposing portions of RDL 110. Finally, in FIG. 6b, process carrier 108 is released and solder bumps 114 are formed on UBMs 102. Optionally, UBMs can be plated to form the final metal pad areas in insulating layer 112.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    providing a first insulating layer contacting the semiconductor die;
    depositing an encapsulant around the semiconductor die, a surface of the encapsulant being coplanar with a surface of the first insulating layer;
    forming a second insulating layer over the first insulating layer; and
    forming an interconnect structure over the semiconductor die by using a laser to form an opening through the first insulating layer and second insulating layer to electrically connect the interconnect structure to the semiconductor die.

2. The method of claim 1, wherein forming the interconnect structure further includes forming a first conductive layer within the laser-formed opening.

3. The method of claim 2, wherein forming the interconnect structure further includes forming a second conductive layer over the second insulating layer.

4. The method of claim 1, further including forming a via through the encapsulant using the laser.

5. The method of claim 4, further including disposing a conductive material within the laser-formed via.

6. A method of making a semiconductor device, comprising:
    providing a semiconductor die;
    depositing an encapsulant in contact with a back surface of the semiconductor die and a side surface adjacent to the back surface of the semiconductor die;
    providing a first insulating layer over the semiconductor die and the encapsulant, the first insulating layer extending beyond a footprint of the semiconductor die;
    forming an interconnect structure over the semiconductor die by using a laser to form a first opening through the first insulating layer extending to the semiconductor die to electrically connect the interconnect structure to the semiconductor die;
    forming a first conductive layer coplanar with a surface of the encapsulant;
    forming a second opening through the encapsulant using the laser, wherein the second opening terminates at the first conductive layer;
    forming a conductive material in the second opening to contact the first conductive layer; and
    forming a second insulating layer extending into the second opening over the conductive material.

7. The method of claim 6, further including:
    forming a third insulating layer over the first insulating layer; and
    forming a third opening through the third insulating layer using the laser.

8. The method of claim 7, wherein forming the interconnect structure further includes forming a second conductive layer within the first laser-formed opening and over the first insulating layer.

9. The method of claim 8, wherein forming the interconnect structure further includes forming a third conductive layer over the third insulating layer.

10. A method of making a semiconductor device, comprising:
    providing a semiconductor die;
    depositing an encapsulant over a back surface of the semiconductor die and around the semiconductor die;
    providing a first insulating layer over the semiconductor die, wherein the first insulating layer includes a first opening;
    forming a second insulating layer over the first insulating layer;
    forming a second opening through the second insulating layer and aligned with the first opening in the first insulating layer;
    forming an interconnect structure over the semiconductor die and within the first opening and second opening;
    forming a third opening through the encapsulant;
    forming a conductive material in the third opening; and forming a third insulating layer extending into the third opening over the conductive material.

11. The method of claim 10, wherein forming the interconnect structure further includes forming a first conductive layer within the first opening and second opening.

12. The method of claim 11, further including:
forming a third insulating layer extending into the first opening and second opening over the first conductive layer; and
forming a second conductive layer over the third insulating layer.

13. A method of making a semiconductor device, comprising:
providing a semiconductor die;
depositing an encapsulant over a back surface of the semiconductor die and around the semiconductor die;
providing a first insulating layer over the semiconductor die and encapsulant;
forming a second insulating layer over the first insulating layer;
forming a first opening through the first insulating layer and second insulating layer using a laser;
forming an interconnect structure over the semiconductor die and within the first opening; and
forming a third insulating layer extending into the first opening over the interconnect structure;
forming a second opening through the encapsulant;
forming a conductive material in the second opening; and
forming a fourth insulating layer extending into the second opening over the conductive material.

14. The method of claim 13, wherein forming the interconnect structure further includes forming a first conductive layer within the first opening.

15. The method of claim 14, wherein forming the interconnect structure further includes forming a second conductive layer over the third insulating layer.

* * * * *